(12) United States Patent
Braun et al.

(10) Patent No.: US 9,702,683 B2
(45) Date of Patent: Jul. 11, 2017

(54) METHOD FOR DETERMINING THE PISTON POSITION OF A PISTON CYLINDER UNIT AND A PISTON CYLINDER UNIT

(71) Applicant: Liebherr-Elektronik GmbH, Lindau (DE)

(72) Inventors: Sebastian Braun, Lindau (DE); Alfred Engler, Sigmarszell (DE); Ralf Cremer, Lindau (DE); Ingo Nannen, Lindenberg (DE)

(73) Assignee: Liebherr-Electronik GmbH, Lindau (DE)

( * ) Notice: Subject to any disclaimer, the term of this patent is extended or adjusted under 35 U.S.C. 154(b) by 0 days.

(21) Appl. No.: 14/162,344

(22) Filed: Jan. 23, 2014

(65) Prior Publication Data

US 2014/0218051 A1   Aug. 7, 2014

(30) Foreign Application Priority Data

Jan. 23, 2013   (DE) .................. 10 2013 001 121

(51) Int. Cl.
| | | |
|---|---|---|
| G01R 35/00 | (2006.01) | |
| G01L 27/00 | (2006.01) | |
| G01B 7/14 | (2006.01) | |
| F15B 15/28 | (2006.01) | |
| G01D 5/165 | (2006.01) | |
| G01R 27/26 | (2006.01) | |
| G01D 5/20 | (2006.01) | |
| G01D 5/243 | (2006.01) | |

(52) U.S. Cl.
CPC ............ *G01B 7/14* (2013.01); *F15B 15/2853* (2013.01); *G01D 5/165* (2013.01); *G01D 5/20* (2013.01); *G01D 5/243* (2013.01); *G01R 27/2611* (2013.01)

(58) Field of Classification Search
CPC .... F15B 15/2853; G01D 5/165; G01D 5/243; G01D 5/20; G01B 7/14; G01R 27/2611
USPC ........................... 73/168, 1.63; 324/601, 654
See application file for complete search history.

(56) References Cited

U.S. PATENT DOCUMENTS

| | | | | |
|---|---|---|---|---|
| 6,311,804 B1* | 11/2001 | Baalmann | ............ | B60T 13/583 188/1.11 E |
| 7,710,109 B2* | 5/2010 | Baak | ................... | F15B 15/2861 324/207.2 |
| 2003/0075403 A1* | 4/2003 | Dernebo | ............ | F15B 15/1466 188/284 |
| 2005/0235742 A1* | 10/2005 | Bengtsson | ............ | F02P 17/12 73/114.67 |

(Continued)

FOREIGN PATENT DOCUMENTS

| | | |
|---|---|---|
| DE | 102005029494 A1 | 1/2007 |
| DE | 102007046139 A1 | 4/2009 |
| DE | 202008010230 U1 | 1/2010 |

(Continued)

*Primary Examiner* — Farhana Hoque
(74) *Attorney, Agent, or Firm* — McCoy Russell LLP

(57) ABSTRACT

The invention relates to a method for determining the piston position of a hydraulic or pneumatic piston cylinder unit, wherein the cylinder jacket and the piston form an electrical conducting path and the piston position is determined with the aid of the inductive and/or resistive properties of the conducting path that is formed. In addition, the invention relates to a piston cylinder unit having a measuring device for carrying out such a method.

12 Claims, 2 Drawing Sheets

(56) References Cited

U.S. PATENT DOCUMENTS

2007/0194781 A1* 8/2007 Zhitomirskiy ......... G01D 5/204
    324/207.17
2010/0089144 A1* 4/2010 Engler ................ F15B 15/2853
    73/168

FOREIGN PATENT DOCUMENTS

| DE | 102011008381 A1 | 7/2012 |
| DE | 102011088381 A1 | 6/2013 |
| FR | 2950401 A1 | 3/2011 |

* cited by examiner

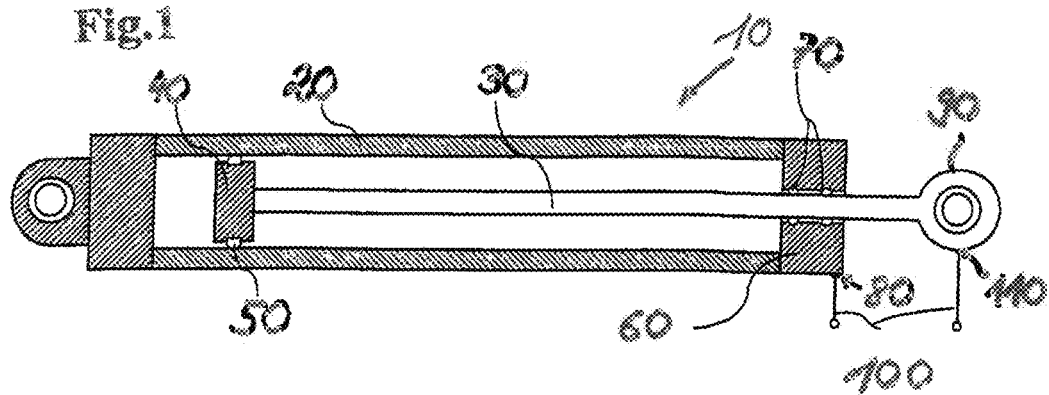
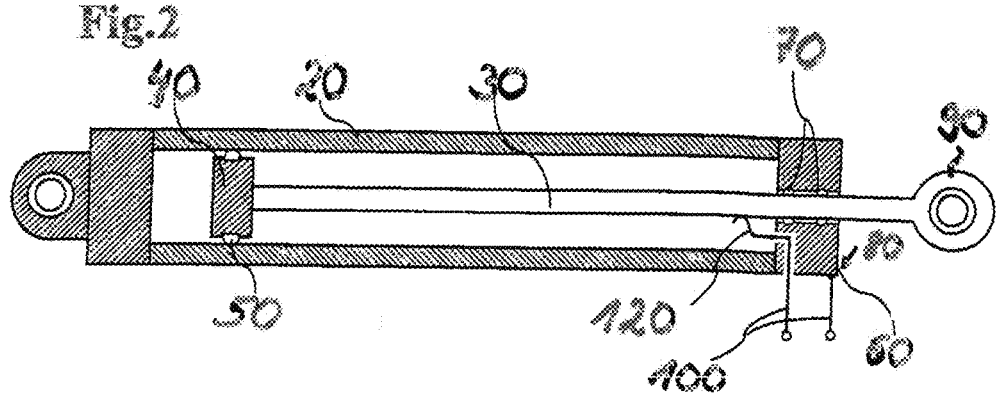
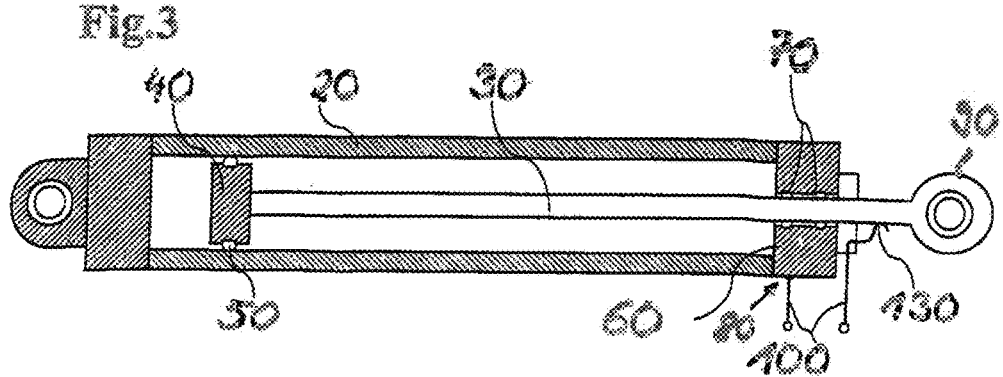

Fig.4
a)
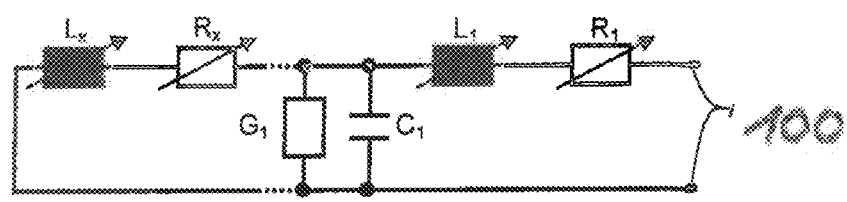
b)
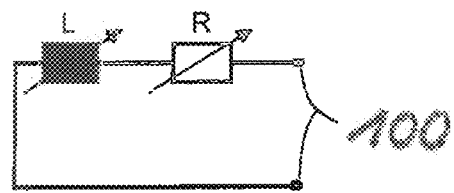

METHOD FOR DETERMINING THE PISTON POSITION OF A PISTON CYLINDER UNIT AND A PISTON CYLINDER UNIT

CROSS REFERENCE TO RELATED APPLICATION

This application claims priority to German Patent Application No. 10 2013 001 121.3, entitled "Method for Determining the Piston Position of a Piston Cylinder Unit and the Piston Cylinder Unit," filed Jan. 23, 2013, which is hereby incorporated by reference in its entirety for all purposes.

TECHNICAL FIELD

The invention relates to a method for determining the piston position of a hydraulic or pneumatic piston cylinder unit as well as a piston cylinder unit with a device for determining the position.

BACKGROUND AND SUMMARY

Determination of the most accurate position of a cylinder piston is a prerequisite for a whole range of technical applications. In particular, a precise piston position is required as the control variable for the automated activation of a piston cylinder unit. In addition, the determination of the position can contribute to safe operation since the inflow of the hydraulic medium, in particular the hydraulic fluid, can be precisely controlled in the extreme positions of the cylinder piston, and thus stopped in time.

Above all, precise determination of the position is important for the automatic control of piston cylinder units in construction machinery and lifting equipment. The piston cylinder unit actuates the working equipment of the construction machinery or lifting equipment in the usual manner. A sufficiently precise determination of the position of the piston cylinder unit increases the control quality and is therefore urgently needed.

The fact that the instantaneous position of the cylinder piston can be detected by mounted draw-wire potentiometers has already been established.

An alternative method for linear expansion measurements of the hydraulic cylinder operates according to a magnetostrictive principle. However, the piston rod must be bored axially into the cylinder for integration of the measuring elements. This is a very costly situation, especially for extremely long cylinders, that requires a great deal of effort using deep drilling technology. Likewise, guiding the cabling required for the measuring electronics used inside the cylinder represents a challenging task.

An additional method for determining the position of hydraulic and pneumatic cylinders is disclosed in DE 10 2005 029 494 A1. The piston cylinder arrangement discussed in this document has a sensor element that interacts with a magnetic probe element. The piston assumes the function of a plunger (probe element) whose position is determined by a path sensor coil (sensor element) and an evaluation circuit. The path sensor coil is located in the far side of the cylinder tube.

Another measurement principle is disclosed in DE 10 10 2011 088 A1. The resonance measurement procedure used here determines the instantaneous position of the piston based on the capacitance and inductance created by the piston cylinder unit. The measured inductance is crucial as the variable that changes in length. However, a disadvantage to the discussed measurement procedure is that sporadically occurring short circuiting effects between the piston and the outer surface, for example by contamination inside the piston cylinder unit, can distort the precision of measurement. This gives rise to a residual risk during the operation of such a cylinder unit.

The object of the present invention is thus to provide the practitioner with an alternative and secure measurement procedure for determining the position of the piston inside a piston cylinder unit.

This objective is achieved by a method according to the features of claim 1. Advantageous embodiments are presented in the dependent claims.

According to claim 1 a method is suggested for determining the piston position of a hydraulic or pneumatic piston cylinder unit. According to the invention, at least parts of the cylinder jacket and the cylinder piston form an electrically conducting path. The instantaneous piston position can be determined with sufficient precision from the inductive and/or resistive properties of the conducting path that is formed.

The invention makes use of the fact that the piston position influences the characteristics of the electrical conducting path. In particular, the length of the path varies with the piston position. The inductive and/or resistive properties of the electrical conducting path can be determined with the aid of suitable evaluation procedures. The values obtained allow a conclusion to be drawn regarding the actual instantaneous piston position.

It is especially advantageous when the cylinder piston is connected conductively with the cylinder jacket and the piston rod and cylinder jacket are insulated with respect to one another. The piston rod, piston, and cylinder jacket thereby form a mutual conducting path.

The conduction characteristics can advantageously be determined by means of an AC and/or DC evaluation procedure. To do this, the conducting path formed is excited with a DC or AC voltage signal, and the inductive or resistive behavior is determined by means of suitable evaluation procedures.

In evaluating the conductive characteristics based on DC or AC voltage signals, the advantage is that it can be carried out independent of the medium present in the cylinder chamber, namely air or a hydraulic medium. Aging of the oil, contamination, and possible temperature influences have no effect, or only extremely small effects, on the measured variables.

For an evaluation procedure based on AC voltages, it is advisable to design the frequency of the AC excitation voltage so that it is preferentially variable in order to assure frictionless operation of a plurality of piston cylinder units on the respective application (e.g., excavator). Shielding can be avoided by suitably selecting the frequency to lie in the low frequency region.

The type of evaluation procedure for determining the conductive characteristics is fundamentally arbitrary. A suitable evaluation procedure is to measure the external resonance of the piston cylinder unit or to measure a pulse response. The concept of an external resonance is intended to signify the resonance frequency of the piston cylinder unit that is to be measured as a function of position, which is obtained by the series connection of a capacitor with the piston cylinder unit. It is also possible to measure the ohmic resistance of the conduction path formed by means of a measuring bridge.

The suggested method has the advantage that it is applicable to any cylinder with an especially small amount of integration effort. In contrast to known procedures, the solution according to the invention is characterized by relatively low production and integration costs. In addition, the method according to the invention is not subject to piston cylinder unit size limitations. The suggested method can thus be implemented in almost any working cylinder.

The invention relates to a piston cylinder unit with a device for position determination according to the features of claim 5. According to the invention, the piston cylinder unit has a conducting connection between the piston and cylinder jacket, and in particular between the piston and the internal wall of the cylinder jacket. An evaluation unit is also provided that is connected directly or indirectly with the piston cylinder unit, and by means of which the instantaneous piston position can be determined as a function of the inductive and/or conducting path formed by the cylinder jacket and piston/-rod.

Ideally, the piston cylinder unit for carrying out the method according to the invention or an advantageous embodiment of the method according to the invention is appropriate. At the same time it is obvious that the piston cylinder unit must have suitable means for implementing the method. The advantages and properties of this piston cylinder unit obviously correspond to those of the method according to the invention or an advantageous embodiment of the method.

It is more reasonable if insulation is provided between the piston rod and the piston rod guide of the cylinder jacket, which enables insulated mounting of the piston rod with respect to the cylinder jacket. It is more reasonable if the existing piston rod seal is used to insulate the piston rod from the cylinder jacket.

In order to form a conducting path between the piston and cylinder jacket, at least one electrically conducting piston ring can be provided that passes fully around the circumference of the piston. It is also possible to use just a partial contact between the piston and cylinder jacket.

Alternatively, one or more sliding contacts can also be attached to the circumference of the piston or on the piston surface, which produce an electrically conducting contact between the piston and cylinder jacket.

The evaluation unit is advantageously electrically connected directly or indirectly to the piston and directly or indirectly to the cylinder jacket. Changing the piston position changes the electrical conducting path between the connectors of the evaluation unit. If the evaluation unit is connected in the region of the piston rod guide of the cylinder jacket, then the electrically conducting path that is formed lengthens as the piston is pushed into the cylinder jacket. The minimum conduction path is obtained as soon as the piston rod is completely withdrawn from the cylinder jacket. The piston stroke determines the minimum and maximum conduction paths.

It is obvious that the evaluation unit can also be connected to the opposite front surface of the cylinder jacket. The conductive characteristics have the opposite behavior.

The connection of the evaluation unit to the piston and the piston rod can either take place inside or outside the cylinder jacket. A fixed arrangement on the piston boss is especially advantageous. A flexible connection is also suitable, for example by means of a sliding contact or an alternative contacting technology.

The evaluation unit advantageously has a means for carrying out an evaluation procedure based on AC or DC voltages. In particular, the evaluation unit comprises one or more signal generators for producing and supplying an AC voltage or DC voltage signal in the conducting path that is formed.

The evaluation of the inductive and/or resistive properties of the conducting path that is formed can be achieved on the basis of different evaluation procedures. It is possible, for example, to measure the external resonance of the piston cylinder unit or to evaluate a pulse response. It is also possible that the evaluation unit has a measuring bridge by which the ohmic resistance of the connected conduction path can be determined.

The invention relates to a construction machine or lifting equipment having a piston cylinder unit according to the present invention, or to an advantageous embodiment of the invention. The advantages and properties of the construction machine or lifting equipment obviously correspond to those of the method according to the invention or the piston cylinder unit according to the invention, so that we will not repeat the description at this point.

Additional advantages and properties of the invention will be explained in greater detail with the aid of several exemplary embodiments.

BRIEF DESCRIPTION OF THE FIGURES

FIG. 1 is a schematic longitudinal section of a first embodiment of the piston cylinder unit according to the present disclosure.

FIG. 2 is a schematic longitudinal section of a second embodiment of the piston cylinder unit according to the present disclosure.

FIG. 3 is a schematic longitudinal section of a third embodiment of the piston cylinder unit according to the present disclosure.

FIGS. 4*a*-4*b* is an are equivalent circuit diagrams for characterizing the electrical conducting path of the piston cylinder unit formed according to the present disclosure.

FIGS. 1 to 3 show different embodiments of the piston cylinder unit 10 according to the invention with a device for determining the position. The design of the piston cylinder unit 10 is similar to a known piston cylinder unit. In particular the Unit 10 includes a tubular cylinder jacket 20, in whose cavity a piston 40 is mounted with a piston rod 30 that can be displaced linearly.

DETAILED DESCRIPTION

The piston cylinder unit 10 is advantageously used in construction machinery and lifting equipment, wherein, for example, an attached piece of working equipment is driven by the piston cylinder unit 10. The automatic operation of the working equipment requires the precise determination of the position of the piston 40.

To enable a determination of the position, additional sensors, electrodes, or transducers must be installed on or in the piston cylinder unit. Instead of this, it is possible to utilize the fact that the resistive and/or inductive properties of the piston cylinder unit 10 vary as a function of the piston position. In order to be able to evaluate the pure inductive and/or resistive properties of the cylinder 10, a conductive connection must be made between the piston 40 and the cylinder jacket 20, or the inner wall of the cylinder jacket 20. The electrical contact is enabled through a piston ring 50 that is arranged coaxially on the piston circumference 40 that has sufficient conductivity. The seal between the cylinder jacket 20 and piston 40 is not affected by the piston ring 50.

Instead of using the electrically conductive piston ring 50, one or a plurality of sliding contacts can be arranged on the piston 40, particularly on the sides of the piston, which produce an electrical connection between the cylinder jacket 20 and piston 40.

The piston rod 30 must also be insulated from the cylinder jacket 20. The existing cylinder seal 70 is used in the piston rod guide, which displays an insulating effect between the piston rod guide and piston rod 30.

An evaluation unit that is not shown here is connected electrically through the two connector poles 100 to the piston cylinder unit 10. The contact with the cylinder jacket surface 20 occurs in the region of the cylinder head 60 at the contact point 80. On the other hand, the contact with the piston rod 30 can be selected at will.

In a first embodiment according to FIG. 1, the evaluation unit is rigidly connected near the contact point 80 directly to the piston boss 90 through the contact point 110. On the other hand, a sliding contact of the evaluation unit with the piston rod 30 is shown in FIG. 2, in that the connection is made with the aid of a sliding contact 120 inside the piston jacket 20. In the same way, the sliding contact between the evaluation unit and piston rod 30 can also lie outside the cylinder jacket, as is accomplished by the sliding contact 130 of the embodiment of FIG. 3.

The selection of the type of connection of the evaluation unit to the piston rod 30 is arbitrary, and has no effect on the precision of measurement. However, during the evaluation the type of connection must be taken into consideration in order to be able to determine the precise piston position. It should be noted here that in the embodiment of FIG. 1 the resulting conducting path between the connector poles 100 of the evaluation unit is defined by the overall length of the piston rod 30, the conducting path between the piston rod 30 and cylinder jacket 20 through the piston 40, and the variable jacket path of the cylinder jacket 20 starting from the instantaneous piston position up to the contact point 80 in the region of the cylinder head 60. This variable conducting path is reduced by moving the piston rod 30 out, and attains its minimum when the piston rod 30 is completely extended. The maximum conducting path is set as soon as the piston rod 30 is pushed fully into the cylinder cavity of the piston cylinder unit 10.

In the embodiments of FIGS. 2 and 3 the contacting of the evaluation unit with the piston rod 30 is implemented by the sliding contacts 120 and 130. According to this, not only is the conducting path of the cylinder jacket surface 20 from the piston 40 to the cylinder head 60 varied, but also the conducting path between the sliding contact 120, 130 and piston 40. The embodiments of FIG. 1 apply to the change in the applied conducting path between the connector poles 100.

The suggested mechanical concept, i.e., the continuous short circuit formation between piston 40 and cylinder jacket 20, creates an electrical network with piston position dependent inductive and/or resistive properties.

The evaluation of these inductive and resistive variables can be accomplished both by AC or DC voltage evaluation procedures. The equivalent circuit diagram of FIG. 4b applies to the case of a DC voltage evaluation procedure or a low frequency AC voltage. The properties of the line shown between the connector poles 100 of the evaluation unit can be characterized roughly by the ohmic resistance R and its inductance L. Both quantities depend on the conduction path or the position of the piston 40.

The evaluation unit can, for example, be implemented as a measuring bridge that is connected to the connector poles 100, and determines the ohmic resistance R of the connected piston cylinder unit 10 as a function of the piston position. The smallest ohmic resistance is registered by the system when the piston rod 30 has been completely withdrawn from the cylinder of the piston cylinder unit 10.

As soon as the wavelengths of the signal are of the order of the conduction path length, the simplified model of FIG. 4b no longer suffices. For this reason the conduction model of FIG. 4a must not be used with high frequency AC voltages in order to be able to describe the inductive and/or resistive variables of the conduction path lengths of the piston cylinder unit 10 with sufficient precision. In particular, FIG. 4a shows the transmission line parameters for describing the line properties in terms of the distributed inductance Lx, distributed resistance Rx, distributed conductance G1, and the distributed capacitance C1. All of these quantities are dependent on the line length or piston position.

In addition to the use of a measuring bridge as the evaluation unit, the inductive and/or resistive variables of the piston cylinder unit can also be determined by detecting the external resonance as well as by measuring the pulse response of the piston cylinder unit 10. The frequency range can also be adjustable in an AC voltage based evaluation, whereby the frequently required screening can be eliminated depending on the procedure used.

The evaluation procedure is moreover independent of the hydraulic medium used in an evaluation by DC or AC voltage signals. Consequently aging of the oil, contamination, and possible temperature effects have no influence, or only extremely small influence, on the precision of measurement.

In addition, the effort expended for integration of the position measuring device in existing cylinder units 10 is held within limits. This not only has a positive effect on routine production costs, but also reduces the required maintenance. There are also no size limitations for the use of the method. The method presented here can be implemented in almost any working cylinder.

In some examples, a method for determining the piston position of a hydraulic or pneumatic piston-cylinder unit is disclosed. The cylinder may include a shell, or external housing, with a piston positioned therein. The piston may be slidingly engaged with an inner wall of the shell. The piston and shell are in electrical contact to form an electrical conduction path. The piston position may be determined by an electronic control system measuring the electrical conduction path on the basis of inductive and/or resistive properties of the formed conduction path. The electronic control system may include code stored in non-transitory memory, including code for determining the piston position based on the measurement of the inductive and/or resistive properties of the conduction path, as the unit operates and moves. The cylinder piston and the cylinder shell may be conductively interconnected, with the piston rod and the cylinder insulated from each other. The memory may further include code for determining the inductive and/or ohmic properties based on a measured AC voltage and/or DC voltage of the path, wherein the frequency of the alternating voltage is variably adjusted by the controller based on operating parameters of the unit. Further, the determination of the inductive and/or resistive properties by the control system may be by measuring the external resonance and/or the impulse response and/or by use of a measuring bridge coupled with the electronic control system.

In some examples, insulation may be positioned directly between the piston rod and a piston rod guide. Additionally, between the piston and the cylinder shell, an electrically conductive piston ring or a sliding contact may be provided. In some examples, the piston rod is fixed to a cylinder eye or electrically conductively flexibly connected inside or outside of the cylinder jacket, in particular connected by means of sliding contact. The control system may further include code stored in memory for carrying out a calculation based on the AC voltage or DC voltage for determining the inductive and/or resistive properties of the piston-cylinder unit.

It can be appreciated that in some examples, accurate positioning can be determined by the control system independent of, and/or without, additional sensors, electrodes, or sensors installed on or in the piston-cylinder unit. Instead, the fact is exploited that the resistive and inductive properties of the piston cylinder unit 10 changes as a function of the piston position in a predetermined way that may be stored in the memory of the control system. While one example evaluation unit is described as an example control system, other approaches may be used. Further, the evaluation unit and/or control system may include one or more sensors coupled to or in the conduction path to provide measurement of the inductive and/or resistive properties of the conduction path.

The invention claimed is:

1. A method for determining a position of a piston of a hydraulic or pneumatic piston cylinder unit, comprising:
   performing an evaluation procedure to determine an inductance of an electrically conductive path formed by the piston, an internal wall of a cylinder jacket, and a piston ring or sliding contact, including exciting the conductive path with an AC voltage;
   performing an evaluation procedure to determine a resistance of the conductive path, including exciting the conductive path with a DC voltage; and
   determining the position of the piston based on the inductance and the resistance of the conductive path,
   wherein there are no additional electrodes on or in the piston cylinder unit.

2. The method according to claim 1, wherein a piston rod of the piston and the cylinder jacket are insulated with respect to one another.

3. The method according to claim 1, wherein a frequency of the AC voltage is variable.

4. The method according to claim 1, further comprising determining the inductive and resistive properties by measuring an external resistance and/or a pulse response and/or by use of a measuring bridge.

5. A piston cylinder unit comprising an evaluation unit and an electrically conductive connection between a piston, an internal wall of a cylinder jacket, and a piston ring or sliding contact, the evaluation unit comprising code stored in non-transitory memory for:
   exciting the conductive connection with an AC voltage and determining an inductance of the conductive connection;
   exciting the conductive connection with a DC voltage and determining a resistance of the conductive connection; and
   determining a position of the piston as a function of the inductance and resistance of the conductive connection between the piston and the cylinder jacket,
   wherein there are no additional electrodes on or in the piston cylinder unit.

6. The piston cylinder unit according to claim 5, wherein insulation is provided between a piston rod of the piston and a piston rod guide.

7. The piston cylinder unit according to claim 5, wherein the evaluation unit is in electrical contact with the piston and the cylinder jacket.

8. The piston cylinder unit according to claim 5, wherein the evaluation unit is in constant electrical contact with a piston rod of the piston at a cylinder boss or flexibly inside or outside the cylinder jacket, and is connected via the piston ring or sliding contact.

9. The piston cylinder unit according to claim 8, wherein the evaluation unit includes a measuring bridge for determining an external resonance and/or a pulse response of the piston cylinder unit.

10. The piston cylinder unit according to claim 5, wherein the evaluation unit is rigidly connected directly to a piston boss.

11. The piston cylinder unit according to claim 5, wherein the conductive connection formed between the piston and the cylinder jacket is a continuous short circuit formation which creates an electrical network with piston position dependent inductive and resistive properties.

12. Construction machinery or lifting equipment comprising a piston cylinder unit, wherein the piston cylinder unit has an electrically conductive connection between a piston, an internal wall of a cylinder jacket, and a piston ring or sliding contact and is provided with an evaluation unit, the evaluation unit comprising code stored in non-transitory memory for:
   exciting the conductive connection with an AC voltage and determining an inductance of the conductive connection;
   exciting the conductive connection with a DC voltage and determining a resistance of the conductive connection; and
   determining a position of the piston as a function of the inductance and resistance of the conductive connection,
   wherein there are no additional electrodes on or in the piston cylinder unit.

* * * * *